STABLE D.C. AMPLIFIER

Filed July 17, 1967

INVENTORS
RICHARD F. LACH
HENRY E. MARTIN
BY Louis H. Reens
ATTORNEY

BY

United States Patent Office 3,419,809
Patented Dec. 31, 1968

3,419,809
STABLE D.C. AMPLIFIER
Richard F. Lach, Hartford, and Henry E. Martin, Wapping, Conn., assignors to United Aircraft Corporation, East Hartford, Conn., a corporation of Delaware
Filed July 17, 1967, Ser. No. 653,719
11 Claims. (Cl. 330—10)

ABSTRACT OF THE DISCLOSURE

A D.C. amplifier is described for driving an A.C. load with a push-pull output amplifier. Two negative D.C. feedback loops are employed to maintain the quiescent voltage of the output terminals at the desired D.C. levels. The entire amplifier described includes an input differential amplifier, an intermediate amplifier including an emitter follower stage and a push-pull amplifier stage which in turn drives the push-pull output amplifier. A chopper is added for driving therewith the A.C. load. The entire circuit is D.C. coupled.

*Background of the invention*

In the field of airborne electronics, it is customary to require that the circuits employed are as small as possible for obvious space and weight conservation. Accordingly, one of the problems encountered in designing a servo-driver amplifier is designing it for incorporation into a micro circuit pack such as described in U.S. Patent 3,-243,661. As it may be observed from inspection of this patent, a large number of components are packed into a very small package. One of the requirements, therefore, is that the servoamplifier utilizes a relatively small amount of power and A.C. coupling capacitors ought to be avoided as much as possible to reduce the size of the package in which such an amplifier can be placed. As a practical matter, large coupling capacitors are incompatible with micro circuit pack fabrication methods.

Another technical requirement imposed upon the amplifier is the requirement of a high open looped gain so that external A.C. feedback could be used to stabilize the closed loop gain and permit loose component tolerances. By increasing the gain of the amplifier to a large value, the tolerances on the resistors and semiconductors may be relaxed sufficiently to permit utilization of, for instance, 5% or in some places even 10% resistors rather than expensive 1% components. Furthermore, the amplifier required is to be capable of handling either A.C. or D.C. inputs from a single ended or differential source. For this reason, a chopper is included and as a result the frequency response of the amplifier should be such as to enable the amplifier to operate at chopper frequency as high as four kilocycles. A final requirement imposed is that no trimming of the amplifier should be necessary for proper operation.

The use of D.C. negative feedback in the prior art is known, as for instance, described in the patent to Offner, 3,018,444. There is no description, however, where such feedback can be employed to D.C. stabilize an amplifier of the type herein described and wherein each of the amplifier stages employs opposite polarity channels with a differential amplifier input.

*Summary of the invention*

Accordingly, a novel D.C. amplifier is provided wherein three basic components are utilized, i.e. a differential amplifier, an intermediate amplifier, and an output amplifier with each of the amplifiers including dual channels for amplifying signals of opposite polarity. Negative feedback loops from the output stage of the output amplifier includes two loops one of which feeds back to the input of the differential amplifier and the other to the intermediate amplifier to stabilize both outputs from the final output amplifier stage.

*Brief description of the drawings*

This novel invention is accomplished with a circuit as described hereafter in connection with the accompanying drawings wherein.

*Description of the preferred embodiment*

Figure 1:
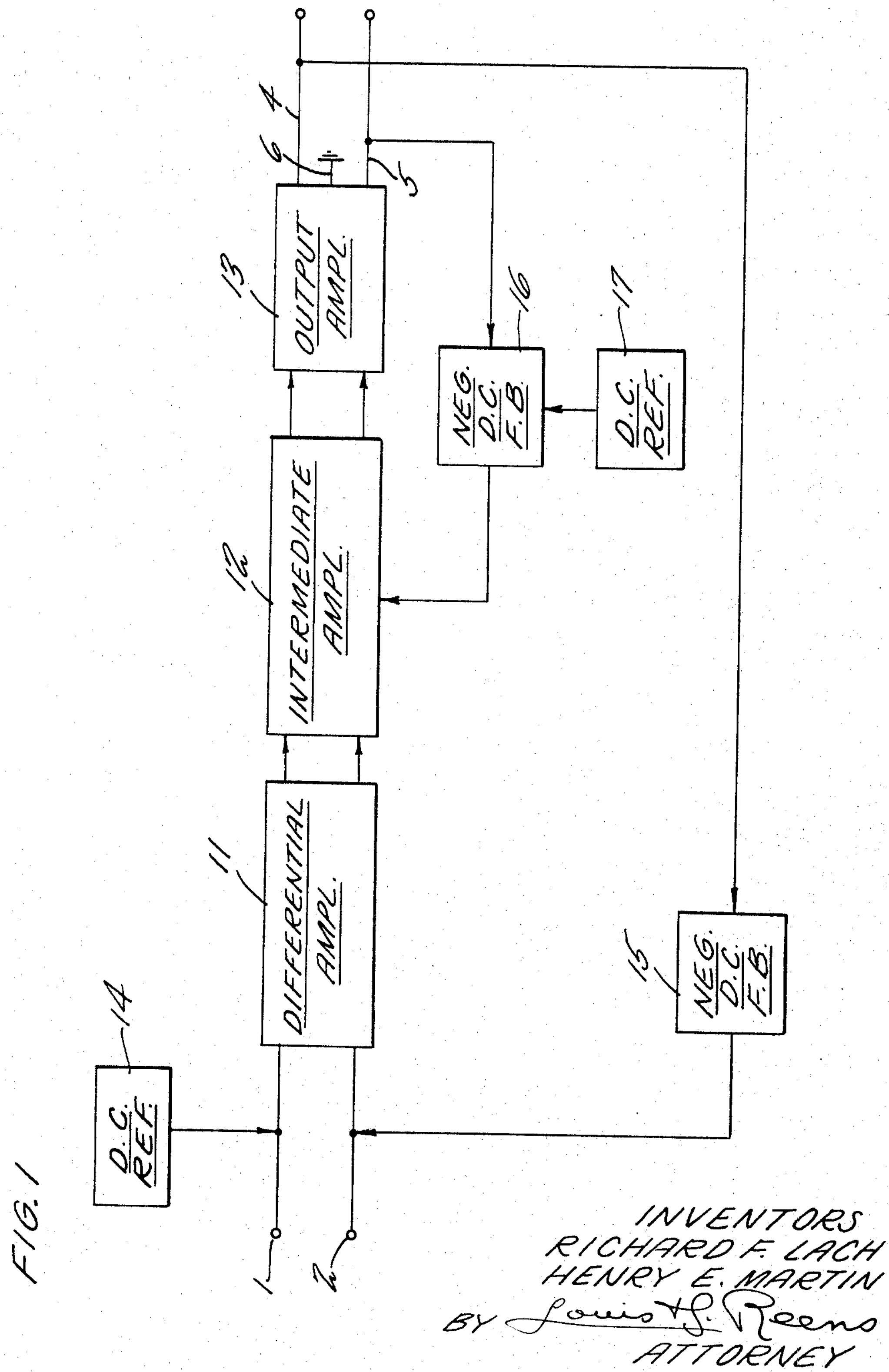
FIG. 1 shows the broad block diagram approach of the amplifier.

In FIG. 1 the entire amplifier is destined for use for driving a servomotor. Accordingly, it is provided with high gain and designed specifically for fabrication into a micro circuit pack. A differential amplifier has its two inputs 1 and 2 connected to some source of A.C. or D.C. signal to be amplified. The output of the differential amplifier is coupled to an intermediate amplifier 12 which in turn drives the output amplifier 13. The D.C. feedback loops are shown, the first incorporates a feedback from terminal 4 of the output amplifier 13 through network 15 to terminal 2 of differential amplifier 11. The second negative D.C. feedback loop is connected to terminal 5 of the output amplifier 13 and fed through negative D.C. feedback network 16 to the intermediate amplifier 12. A D.C. reference source 14 is coupled to terminal 1 of the differential amplifier and determines the D.C. voltage at terminal 4 of the output amplifier. Another D.C. reference source 17 is applied to negative feedback network 16 to control the D.C. voltage level of terminal 5 of the output amplifier 13. These D.C. reference sources may of course be the same, for instance, around zero potential or a different voltage level determining upon the requirements. In a case where the output amplifier drives a servomotor from a push-pull stage it would be desirable to reference both terminals 4 and 5 to ground in the absence of any A.C. input signal at terminals 1 and 2.

Figure 2:
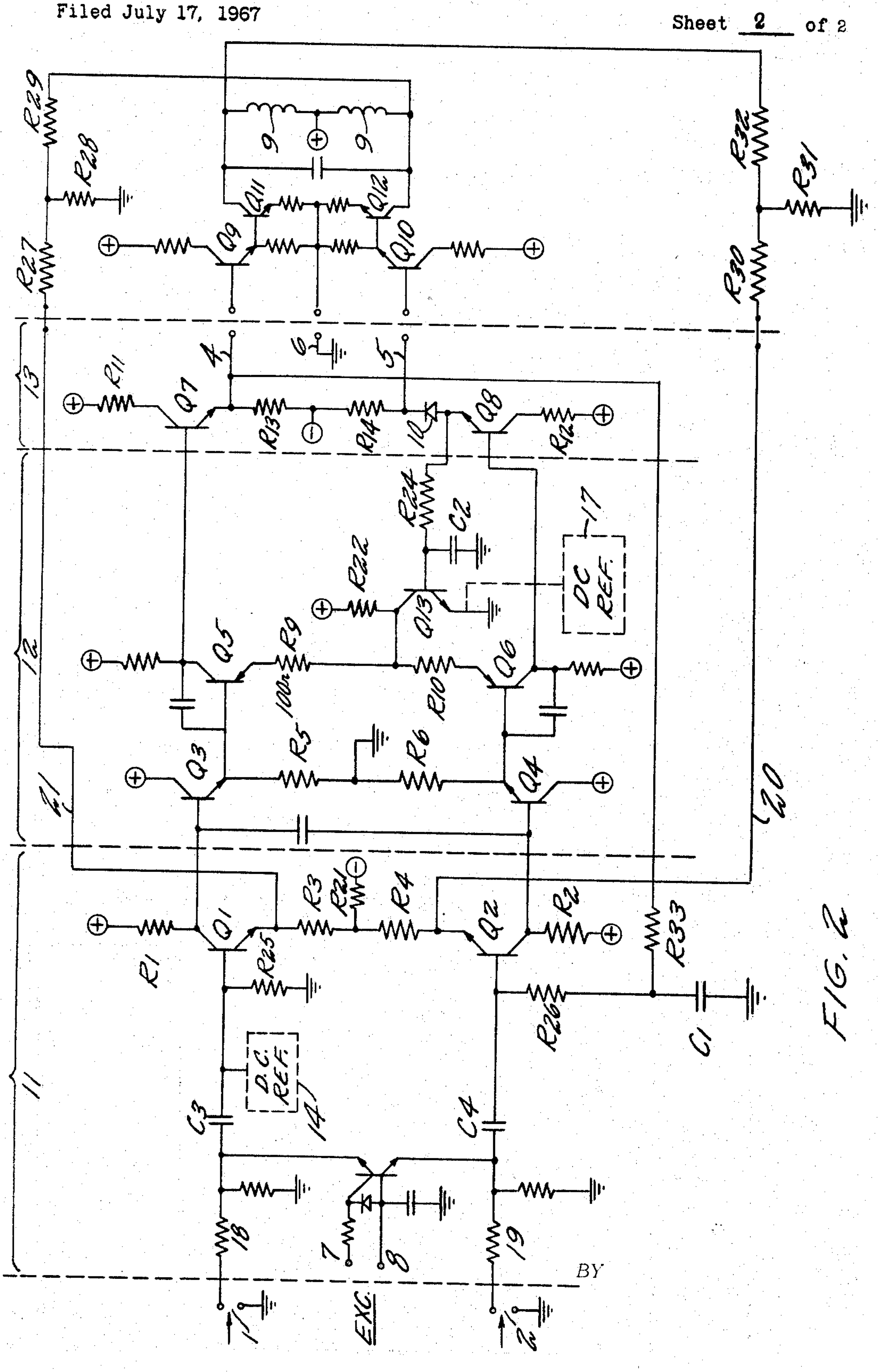
FIG. 2 illustrates the detailed circuitry for accomplishing the function of FIG. 1.

In FIG. 2 corresponding numbers are applied to corresponding items referred to in relation to FIG. 1. The input terminals 1 and 2 are shown connected through resistive networks 18 and 19 recspectively. The terminal 1 is connected through capacitor C–3 to the base of transistor Q–1 and the terminal 2 is coupled through the capacitor C–4 to the base of transistor Q–2. Transistors Q–1 and Q–2 are connected in differential amplifier relationship so that the output across their collectors form the difference of the two signals. In addition, a resistor R–25 is connected to ground from the base of transistor Q–1. The transistor Q–1 forms a channel of a first polarity of the differential amplifier and the transistor Q–2 amplifies a signal of the opposite polarity. Each of these transistors is coupled to an amplifying stage within the intermediate amplifier 12. This amplifying stage comprises transistors Q–3 and Q–4 connected in an emitter follower relationship and drive the push-pull amplifier stage comprising transistors Q–5 and Q–6. The output is taken from the collectors of transistors Q–5 and Q–6 to drive the output amplifier 13 comprising the transistors Q–7 and Q–8 connected in push-pull relationship. Thus a channel comprising transistors Q–1, Q–3, Q–5, and Q–7 for amplifying a signal of the first polarity is provided as well as a second channel comprising transistors Q–2, Q–4, Q–6, and Q–8 for amplifying the signal of the opposite polarity is shown.

The circuitry between terminals 1 and 2 and the output terminals 4 and 5 encompasses the total circuitry enclosed in a micro circuit pack. External thereto Q–2 is a servomotor load 9 driven by two push-pull amplifier stages, the first stage comprising transistors Q–9 and Q–

10 coupled to terminals 4 and 5 and in turn driving the final push-pull amplifier output stage including transistors Q–11 and Q–12. A ground connection and return is provided through terminal 6 between the load and the servoamplifier in the micro circuit pack.

An AC feedback loop is provided comprising resistors R–27, R–28, and R–29 from one side of the load 9 to the opposite polarity side at the differential amplifier stage 11. A similar A.C. feedback loop is provided from the other side of load 9 to the other polarity side of the differential amplifier 11.

The first D.C. feedback loop is made up of resistors R–33, R–26, and capacitor C–1 and interconnects the pin 4 with the base of transistor Q–2. It is designed to control the quiescent level of pin 4. This is accomplished as follows. The base of transistor Q–1 is referenced to ground through resistor R–25 so that it is essentially at zero volts. The voltage at the emitter of transistor Q–7 is fed back through the resistors R–33 and R–26 to the base of transistor Q–2. Now transistors Q–1 and Q–2 art connected up in a differential amplifier configuration so that the collector voltage at Q–1 will change in direct proportion to the difference in the two base to ground voltages at Q–1 and Q–2.

Assume, for instance, that initially the voltage at the emitter of Q–7 is not zero but some positive voltage. This causes the collector voltage of Q–2 to drop and in turn that of Q–1 to rise. This change in collector voltage at Q–1 is directly coupled to the base of transistor Q–5 with negligible attenuation by means of the emitter follower made up of Q–3 and R–5. The increasing base voltage of Q–5 in turn causes the collector voltage of Q–5 to decrease. This decrease in turn is directly coupled to the base of the emitter follower made up of Q–7 and R–13 causing the emitter to ground voltage to decrease. Eventually a steady state operating point is achieved where the two base to ground voltages of Q–1 and Q–2 are equal and, therefore, no further correction will take place. As soon as this condition has been reached. the D.C. output at pin 4 will be approximately zero volts, i.e. the voltage of the base of transistor Q–1. The usual purpose of the capacitor C–1 is to shunt out any A.C. feedback voltages that would otherwise result in a lowering of the A.C. open loop gain of the amplifier.

The D.C. feedback which forces the output of pin 4 to remain at zero volts causes the output at pin 5 to increase above zero volts by the same amount required to bring pin 5 to increase above zero volts by the same amount required to bring pin 4 back to zero volts. This requires a second D.C. feedback loop to control the D.C. quiescent operating point of pin 5 at approximately the desired zero volts.

The second negative D.C. feedback loop is made up of diode 10, resistor R–24, capacitor C–2, and transistor Q–13. This loop works as follows. Diode 10 is employed to overcome the contact potential on transistor Q–13. Assume initially that as a result of the regulation of the output of pin 4 to the desired level of zero volts that the output at pin 5 is some negative voltage. This negative voltage plus a positive voltage due to the drop across diode 10 is fed through resistor R–24 to the base of transistor Q–13. This in turn causes the conduction of Q–13 to decrease. This in turn causes an increase in the currtnt through transistor Q–6 and of the same magnitude as the decrease in current through transistor Q–13. As a result, the collector voltage of transistor Q–6 increases and this increase is directly coupled to the emitter follower made up of resistor R–14, diode 10, and transistor Q–8 causing tht latter's emitter to ground voltage to increase.

Eventually, a steady state operating point is achieved such that the emitter to ground voltage of transistor Q–8 is approximately equal to the drop across the diode 10. This in turn implies that pin 5 is essentially at zero volts. It should be noted here that the point of introduction of the second D.C. feedback loop has no effect on the collector voltage of the transistor Q–5, which is under the control of the first negative D.C. feedback loop. Capacitor C–2 again serves the same purpose as the capacitor C–1, namely, to shunt out any A.C. feedback voltages that would reduce the A.C. open loop gain of the amplifier.

Instead of the resistor 25 to ground at the base of transistor Q–1 it is possible that it be replaced with a D.C. reference voltage from a network 14 such as a battery. By setting a particular reference voltage at this terminal the potential at pin 4 will be held to that level. Correspondingly, the emitter of transistor Q–13 instead of being coupled to ground as shown may be biased by a D.C. reference source 17, again including a battery, and as a result the pin 5 quiescent voltage condition will be that of the D.C. reference voltage source 17. It thus may be seen that the zero volt conditions at the base of transistor Q–1 and at the emitter of transistor Q–13 are special cases for the control of the quiescent D.C. voltage levels at the output pins 4 and 5.

Further as shown in FIG. 1 the inputs 1 and 2 include a chopper drive through pins 7 and 8 for chopping the D.C. signal which may then be amplified by the circuitry within the micro circuit pack to drive the servomotor 9. Dual A.C. feedback loops are used to set the overall close loop again of the amplifier to the desired value.

Having thus described a particular embodiment of my invention, the advantages and results obtained are certainly unusual. The double D.C. feedback loops hold the quiescent operating points at any desirable voltage depending upon the reference values used and eliminate large coupling capacitors otherwise needed between transistors Q–7, Q–9, and Q–8, Q–10. In conventional servomotor drives transformer coupling is used to isolate the output amplifier stage from the load. Such a transformer eliminates a requirement of tight D.C. quiescent value control of the output amplifier but it incorporates substantial weight and space where large powers are needed to drive the motor. This bulky component is dispensed with by use of my invention rendering a more economical and useful amplifier. Further the amplifier is designed to work with either D.C. or A.C. input signals.

We claim:

1. A D.C. amplifier for D.C. coupling to a load comprising:
  a differential amplifier,
  an intermediate amplifier responsive to the D.C. output of the differential amplifier,
  an output amplifier responsive to the output of the intermediate amplifier and being D.C. coupled to the load,
  each of said aforementioned amplifiers including a first amplifier channel for a signal of a first polarity and a second amplifying channel for a signal of the opposite polarity with subsequent like channels of said amplifiers coupled to one another,
  means providing the one input of the differential amplifier with a first reference D.C. voltage level,
  first negative D.C. feedback means coupled to the output of one of the channels of the output amplifier and the other input of the differential amplifier for controlling the D.C. level of the one output amplifier channel substantially to said first reference level,
  second negative D.C. feedback means coupled between the output of the other channel of the output amplifier and the intermediate amplifier for controlling the D.C. voltage level of said other output amplifier channel.

2. A device as recited in claim 1 wherein said second negative D.C. feedback means includes:
  means for providing a second D.C. voltage reference level, and
  wherein said second negative D.C. feedback means controls the D.C. voltage level of said other output amplifier channel to substantially said second reference level.

3. A device as recited in claim 2 wherein said first and second D.C. reference levels are alike.

4. A device as recited in claim 3 wherein said first D.C. reference level providing means includes a resistor coupled from said one input of the differential amplifier to ground.

5. A device as recited in claim 4 wherein said D.C. negative feedback means further includes a transistor,
the base of the transistor coupled to said output of said other channel with the emitter of said transistor biased by said second D.C. voltage reference level,
and wherein the collector of said transistor is operatively connected in negative feedback relationship with said intermediate amplifier.

6. A device as recited in claim 5 wherein said second D.C. voltage reference level comprises an electrical conductor from said emitter to ground.

7. A D.C. amplifier for D.C. coupling to a level comprising:
a differential amplifier input stage,
an intermediate amplifier responsive to the output from the differential amplifier,
an output amplifier responsive to the output from said intermediate amplifier,
each of said amplifiers including:
a first polarity amplifying channel and a parallel opposite polarity amplifying channel with like subsequent channels coupled to one another,
first negative D.C. feedback means coupled from the output of one of the output amplifier channels to one of the differential amplifier input corresponding to an opposite polarity channel for controlling the D.C. voltage level of said one output amplifier channel,
second negative D.C. feedback means coupled from the output of the other output amplifier channel to the output of one of the intermediate amplifier channel having a like polarity for controlling the D.C. voltage level of said other output amplifier channel.

8. A device as recited in claim 7 and further including means for controlling the D.C. voltage of the output amplifier to substantially zero volts, said means including:
a resistor interconnecting the other differential amplifier input to ground,
and zero volt biasing means coupled to said second D.C. negative feedback means.

9. A device as recited in claim 8 wherein said intermediate amplifier comprises a first push-pull amplifier and wherein said output amplifier comprises a second push-pull amplifier.

10. A device as recited in claim 9 and further including:
first A.C. negative feedback means coupling one polarity of the load voltage to the opposite polarity channel of the differential amplifier,
second A.C. negative feedback means coupling the other polarity of the load voltage to the opposite polarity channel of the differential amplifier.

11. A device as recited in claim 10 and further including:
an input circuit, said input circuit having a first pair of terminals for passing an A.C. input signal to the inputs of the differential amplifier,
and a chopper circuit for applying D.C. input signals to the inputs of the differential amplifier.

References Cited

UNITED STATES PATENTS 3,188,576 6/1965 Lewis ------------ 330—30 X

ROY LAKE, *Primary Examiner.*

JAMES B. MULLINS, *Assistant Examiner.*

U.S. Cl. X.R.

330—19, 25, 28, 30, 69, 83, 84, 97, 100, 15